United States Patent
Li et al.

(10) Patent No.: US 11,419,232 B2
(45) Date of Patent: Aug. 16, 2022

(54) DOPED METAL OXIDE COATING HAVING INCREASED COLOR DURABILITY

(71) Applicant: Apple Inc., Cupertino, CA (US)

(72) Inventors: Hoishun Li, San Jose, CA (US); Zechariah D. Feinberg, San Francisco, CA (US); Theodore A. Waniuk, Lake Forest, CA (US)

(73) Assignee: Apple Inc., Cupertino, CA (US)

( * ) Notice: Subject to any disclaimer, the term of this patent is extended or adjusted under 35 U.S.C. 154(b) by 121 days.

(21) Appl. No.: 16/869,061

(22) Filed: May 7, 2020

(65) Prior Publication Data

US 2021/0084784 A1  Mar. 18, 2021

Related U.S. Application Data

(60) Provisional application No. 62/902,308, filed on Sep. 18, 2019.

(51) Int. Cl.
| | | |
|---|---|---|
| *H05K 5/04* | (2006.01) | |
| *C22C 38/00* | (2006.01) | |
| *C22C 16/00* | (2006.01) | |
| *C22C 14/00* | (2006.01) | |
| *C23C 14/08* | (2006.01) | |

(52) U.S. Cl.
CPC ............. *H05K 5/04* (2013.01); *C23C 14/08* (2013.01); *C22C 14/00* (2013.01); *C22C 16/00* (2013.01); *C22C 38/00* (2013.01)

(58) Field of Classification Search
None
See application file for complete search history.

(56) References Cited

U.S. PATENT DOCUMENTS

| | | | |
|---|---|---|---|
| 2013/0008796 A1* | 1/2013 | Silverman | C25D 11/246 205/50 |
| 2014/0126130 A1* | 5/2014 | Aurongzeb | H05K 5/0004 361/679.02 |
| 2018/0062294 A1* | 3/2018 | Curran | G06F 1/1633 |
| 2018/0257180 A1* | 9/2018 | Jeon | B23K 20/04 |

OTHER PUBLICATIONS

Canulescu et al., "Band gap structure modification of amorphous anodic Al oxide film by Ti-alloying", (2014) 121910, Applied Physics Letters, vol. 104, pp. 1-4 (Year: 2014).*

Chilimoniuk et al., "Nanoporous Anodic Aluminum-Iron Oxide with a Tunable Band Gap Formed on the FeAl3 Intermetallic Phase", Aug. 6, 2020, Materials, vol. 13, 3471, pp. 1-10. (Year: 2020).*

Zekaik et al., "Synthesis and characterization of Cu doped chromium oxide (Cr2O3) thin films", 2019, High Temperature Materials Processing, vol. 38, pp. 806-812. (Year: 2019).*

\* cited by examiner

*Primary Examiner* — Xiaobei Wang
(74) *Attorney, Agent, or Firm* — Dorsey & Whitney LLP

(57) ABSTRACT

This application relates to a portable electronic device. The portable electronic device includes an enclosure having a metal oxide coating, the metal oxide coating including a metal alloy substrate that is doped with a dopant, and a metal oxide layer overlaying and formed from the metal alloy substrate so that the metal oxide layer includes the dopant.

18 Claims, 11 Drawing Sheets

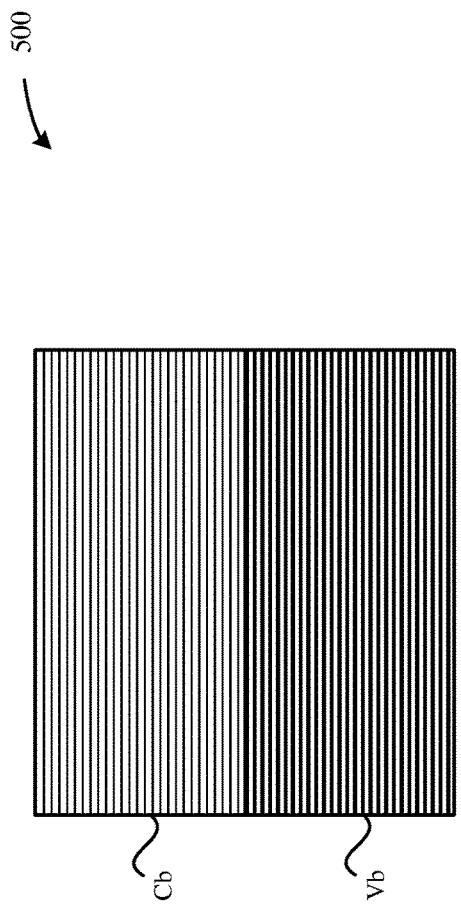
FIG. 5A
FIG. 5B
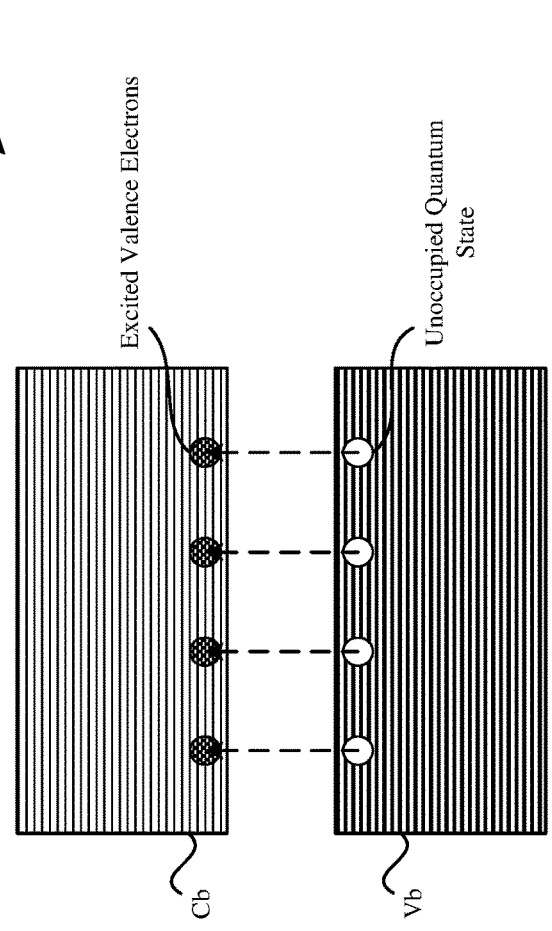
FIG. 6A
FIG. 6B

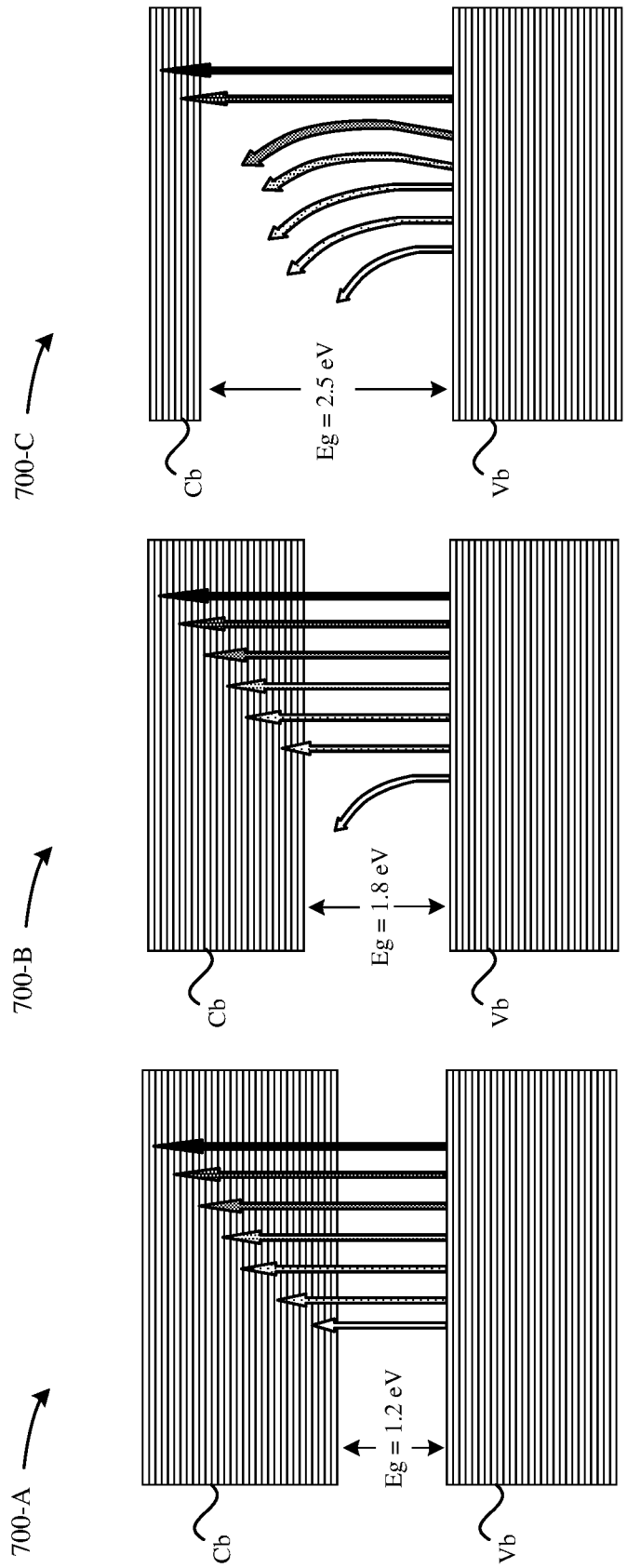

DOPED METAL OXIDE COATING HAVING INCREASED COLOR DURABILITY

CROSS-REFERENCE TO RELATED APPLICATION(S)

This claims priority to U.S. Provisional Patent Application No. 62/902,308, filed 18 Sep. 2019, entitled "DOPED METAL OXIDE COATING HAVING INCREASED COLOR DURABILITY," the entire disclosure of which is hereby incorporated by reference.

FIELD

The described embodiments relate generally to a metal oxide coating that is intentionally doped with a foreign atom or impurities. More particularly, the described embodiments relate to methods for doping the metal oxide coating of an enclosure for a portable electronic device with a foreign atom such as to impart the enclosure with a color.

BACKGROUND

Enclosures for portable electronic devices may be manufactured from different types of metals, which may be colored with dyes in order to improve their aesthetic appearance. For example, anodized coatings may be colored with various dyes. However, the color of these dyed anodized coatings is susceptible to fading and chipping when the enclosures are subjected to environmental exposure (e.g., UV exposure, saltwater exposure, mechanical damage, etc.). Accordingly, there is a need to provide a most robust manner for coloring these enclosures.

SUMMARY

This paper describes various embodiments that relate to a metal oxide coating that is intentionally doped with a foreign atom or impurities. More particularly, the described embodiments relate to methods for intentionally doping the metal oxide coating of an enclosure for a portable electronic device with a foreign atom such as to impart the enclosure with a color.

According to some embodiments, a portable electronic device is described. The portable electronic device includes an enclosure having a metal alloy substrate that includes a dopant, and a metal oxide layer overlaying and formed from the metal alloy substrate so that the metal oxide layer includes the dopant.

According to some embodiments, an enclosure for a portable electronic device is described. The enclosure includes a substrate that includes a metal alloy, and a metal oxide layer overlaying the substrate, where the metal oxide layer includes a dopant so that the metal oxide layer is characterized as having a band gap.

According to some embodiments, an enclosure for a portable electronic device is described. The enclosure includes a metal substrate, and a metal oxide coating overlaying the metal substrate, the metal oxide coating including a first surface portion and a second surface portion adjacent to the first surface portion, where the first surface portion includes a first dopant and the second surface portion includes a second dopant different than the first dopant.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

FIGS. 5A-5B illustrate cross-sectional views of a metal substrate having a color, in accordance with some embodiments.

FIGS. 6A-6B illustrate cross-sectional views of a doped metal oxide coating having a color in accordance with a band gap, in accordance with some embodiments.

FIGS. 7A-7C illustrate various exemplary doped metal oxide coatings having different colors, in accordance with some embodiments.

DETAILED DESCRIPTION

Figure 1:
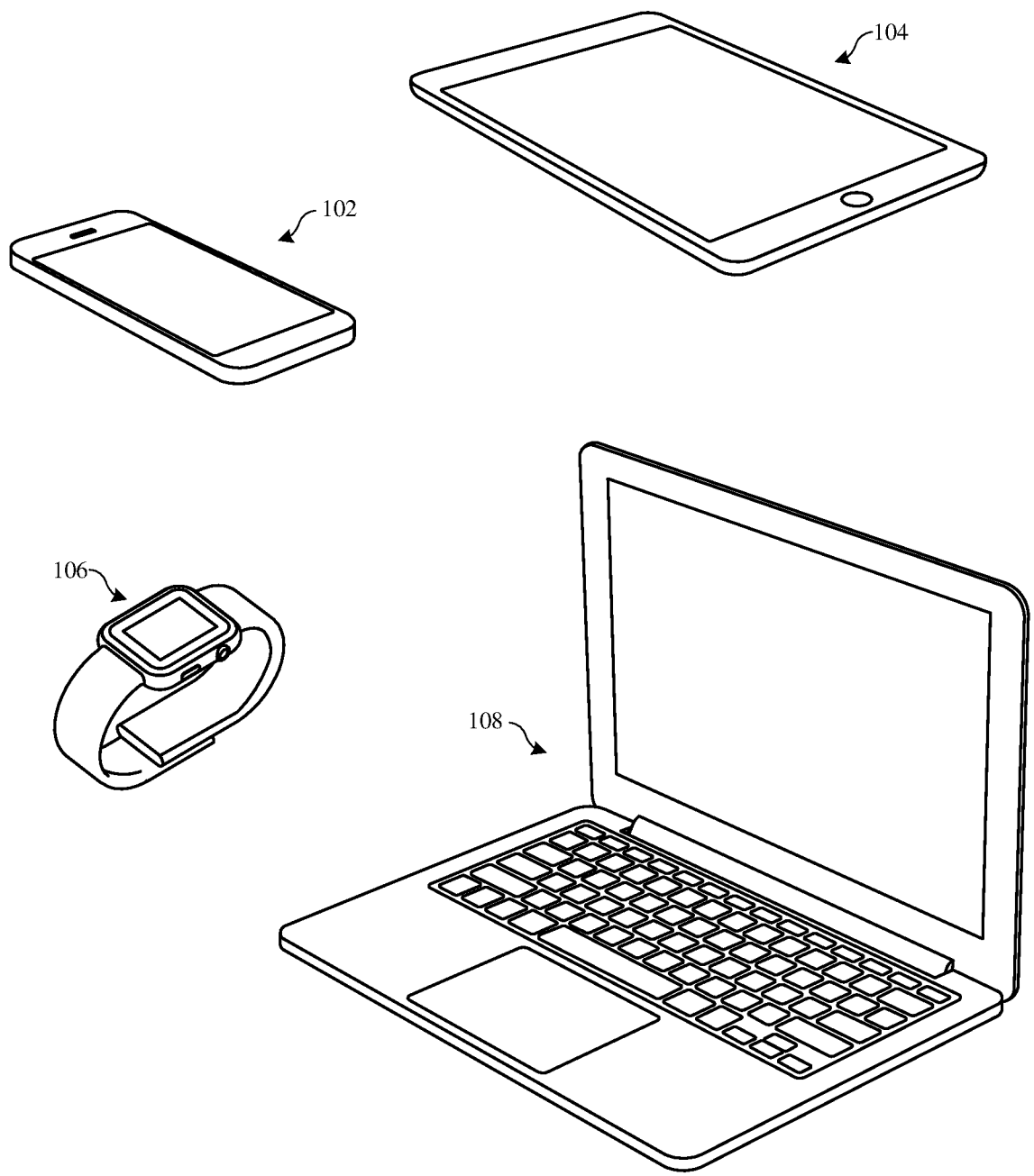
FIG. 1 illustrates perspective views of various portable electronic devices having enclosures that may be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Enclosures for portable electronic devices may be manufactured from different types of metals, which may be subsequently colored with dyes in order to improve their aesthetic appearance. For example, anodized coatings may be colored with various dyes. However, the majority of the dye of an anodized coating is concentrated towards the upper region. As a result, the color of these dyed anodized coatings is susceptible to fade and chipping when the enclosures are subjected to environmental exposure (e.g., UV exposure, saltwater exposure, dropping, etc.). In another example, physical vapor deposition may be utilized to form a metal oxide layer having different colors. However, the metal oxide layer formed by physical vapor deposition is susceptible to delamination when induced to strain. In another example, light interference coloring may also be undesirable due to the ease of changing the color, such as by adding finger oil to the surface of the anodized coating. Accordingly, there is a need for a more robust way of coloring enclosures.

Additionally, the more robust methods for coloring these enclosures cannot affect the ductility and strength of the metals that comprise these enclosures. According to some embodiments described herein, one technique for coloring these enclosures includes doping the metal and/or the metal oxide coating formed thereof with a foreign atom. For example, a metal substrate may be doped with at least one foreign atom, and subsequently oxidized to form a doped metal oxide layer. The doped metal oxide layer has a color that corresponds to a band gap of the metal oxide material of the metal oxide layer. Advantageously, the color of the doped metal oxide layer is not dependent upon a thickness of the doped metal oxide layer—therefore, the color is more vibrant and resistant to chipping, scratching, and UV light exposure relative to conventional coloring techniques. In some instances, the color of the doped metal oxide layer may be referred to as intrinsic coloring because the color is based upon a band gap of the metal oxide material. Furthermore, because the metal substrate and/or metal oxide layer is doped with the foreign atom, instead of micro-alloyed with the foreign atom, the metal substrate and/or metal oxide layer maintains its pre-existing amount of ductility and hardness.

As described herein, the term "doping" refers to the substitution of a foreign atom or an external atom into a metal matrix that comprises a crystal lattice of a metal material or a metal oxide material. The foreign atom or the external atom refers to an element (e.g., Zr, Ce, etc.) that may not be included in the underlying metal substrate or metal alloy substrate from which the metal oxide material was formed from. For example, if the underlying metal substrate includes zirconium, then the external atom may not be zirconium. It should be noted that the foreign atom itself is not colored, and the color of the resulting doped metal oxide layer is a result of a change in band gap.

Additionally, as used herein, the term "doping" is not to be confused with an alloying element or alloying process. For example, some metal alloys include trace amounts of the alloying element in order to increase hardness or ductility. Thus, the alloying element is used to alter physical, mechanical or chemical properties of the material being alloyed. Additionally, the alloying element is added through a combination of heat and/or pressure. However, unlike the alloying element, the doping element is added at the atomic scale as the doping element substitutes itself for a metal atom present in the crystal lattice that comprises the metal or metal alloy or is integrated into the crystal lattice interstitially. As a result, the doping element does not result in the formation of a new crystalline phase/structure. In contrast, the micro-alloying element leads to the formation of a new crystalline phase/structure.

As described herein, doping is used to alter the electrical properties of a metal part (e.g., substrate, oxidized metal substrate, etc.). For example, the metal part has greater electrical potential after being doped with a foreign atom. In some embodiments, a doped metal part may include a band gap that defines a space between the valence band and the conduction band. Below the band gap is a valence band that contains a full complement of valence electrons in the absence of being triggered by energy (e.g., photons of light). Above the band gap is a conduction band. Valence electrons that are excited to this level are available to conduct. In some embodiments, the band gap refers to the energy difference between the two energy levels (represented by the conduction band and the valence band). Valence electrons present in the conduction band have the ability to move throughout the crystal lattice of the material, thereby enabling the material to conduct. Introducing different doping elements into the material results in altering the color of emitted light by the doped material.

In some examples, the color of the doped metal oxide layer may be characterized according to CIE L*a*b* color-opponent dimension values. The L* color opponent dimension value is one variable in an L*a*b* color space. In general, L* corresponds to an amount of lightness. L*=0 represents an extreme black while L*=100 represents white. In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

According to some embodiments, a portable electronic device is described. The portable electronic device includes an enclosure having a metal alloy substrate that includes a dopant, and a metal oxide layer overlaying and formed from the metal alloy substrate so that the metal oxide layer includes the dopant.

These and other embodiments are discussed below with reference to FIGS. 1-10; however, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process surfaces of enclosures of the portable electronic devices. In some examples, the enclosures can include at least one of a metal, a metal alloy, a polymer, glass, ceramics, or a thermoplastic. In some examples, the enclosure can include a metal part that is attached to a non-metal part. According to some embodiments, the techniques described herein may be utilized to impart the enclosure with a color that is based on a band gap of a material of the enclosure.

FIG. 1 illustrates exemplary portable electronic devices including a smartphone 102, a tablet computer 104, a smartwatch 106, and a portable computer 108 that include enclosures that may be processed using the techniques as described herein. These exemplary portable electronic devices may be capable of using personally identifiable information that is associated with one or more users. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Surface(s) of the portable electronic devices 102, 104, 106, 108 described herein may assume any number of desired surface geometries and surface finishes. In some examples, the enclosures may have a three-dimensional structure having a height, width, and depth, and any type of geometry. In particular, the enclosures is characterized as rectangular, polygonal, circular, beveled edges, angular edges, elliptical, etc.

FIGS. 2A-2D illustrate cross-sectional views of a process for forming a doped metal oxide coating, in accordance with some embodiments. In some embodiments, a metal part 200, that is processed according to the techniques described herein, has a near net shape of a final part, such as the enclosures of the portable electronic devices 102, 104, 106, and 108.

Figure 2A:
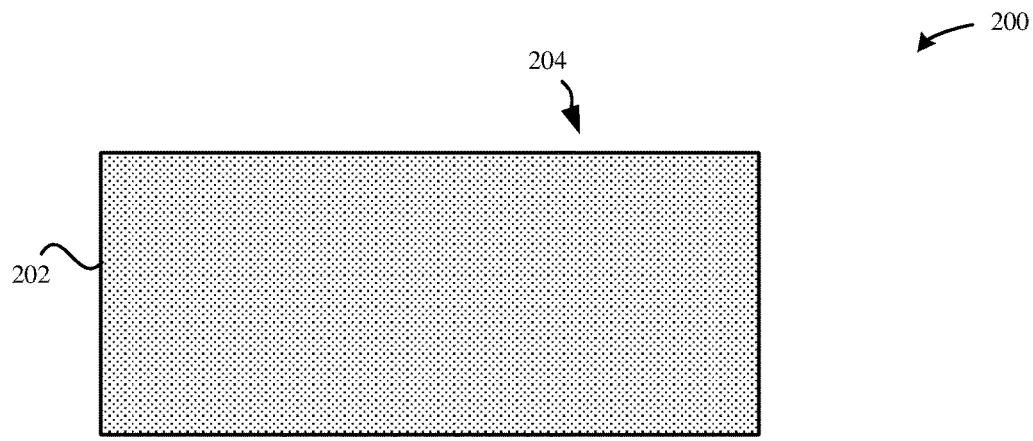
FIGS. 2A-2D illustrate cross-sectional views of a process for forming a doped metal oxide coating, in accordance with some embodiments.

FIG. 2A illustrates a cross-sectional view of a metal part 200 prior to undergoing a process for forming a doped metal oxide coating. In some examples, the metal part 200 is a metal substrate formed of a pure metal or a metal alloy. For example, the metal part 200 may be formed of stainless steel, zirconium alloy or a titanium alloy. Notably, the metal part 200 may be characterized as lacking a band gap or having a narrow band gap less than 1.7 eV. A band gap of about 1.7 eV corresponds to the lowest energy of visible light. In other words, the metal part 200 is characterized as having a black or near black color. In particular, the atoms that comprise the metal material of the metal part 200 are sufficiently close together so that the distinct energy levels of the conduction band and the valence band interact. The low energy level of the valence band overlaps with the high energy level of the conduction band so that the metal part 200 lacks a band gap or has a narrow band gap less than 1.7 eV. In some examples, an external surface 204 of the metal substrate 204 may be polished prior to the doping process in order to increase the luster of the external surface 204.

Figure 2B:
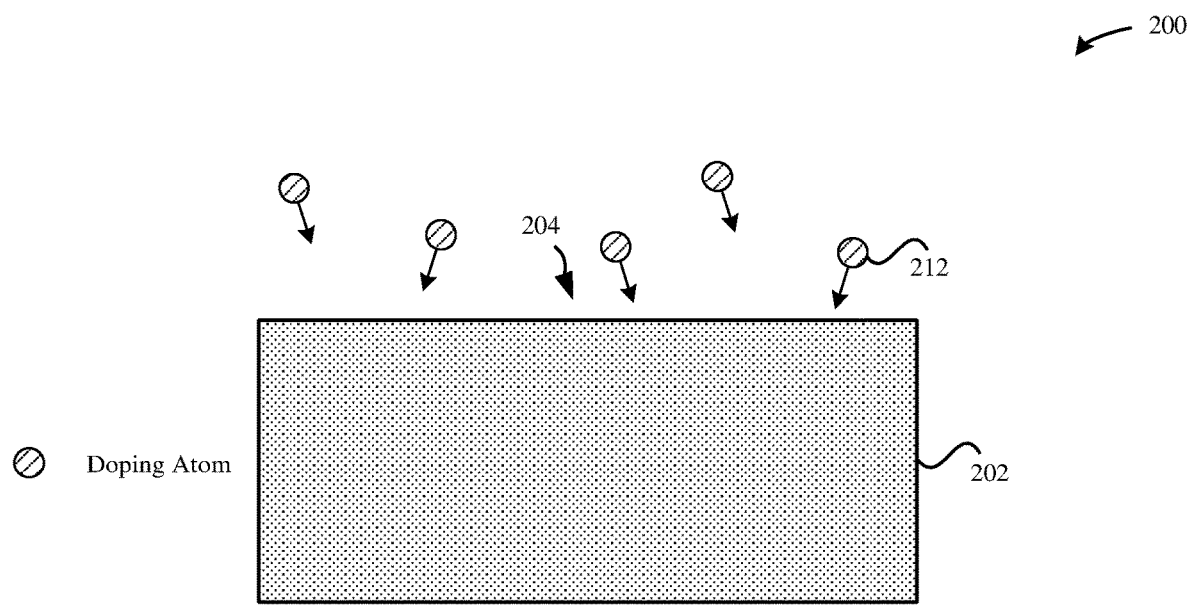

FIG. 2B illustrates a cross-sectional view of the metal part 200 that is exposed to a doping process, in accordance with some embodiments. In some embodiments, the metal part 200 is exposed to at least one doping atom 212. In some examples, the at least one doping atom 212 includes one type of element, and or if the metal part 200 is exposed to multiple doping atoms 212, then the metal part 200 may be exposed to different types of elements. In particular, the doping atom 212 may include at least one of a rare earth mineral or a transition metal. It should be noted that for purposes of the techniques described herein, only rare earth minerals and transition metals may be used as dopants because rare earth minerals and transition metals have the requisite number of valence electrons to transition from a lower energy level of the valence band to occupy a higher energy level of the conduction band. Therefore, the doping atom 212 may also be referred to as a doping ion due to having a positive charge or a negative charge based upon having an unequal number of electrons and protons.

Particular examples of the doping atom 212 that may be incorporated into the metal part 200 include cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). More preferably, the doping atom 212 may be Ce, Pr, Er, Ni, Co, Fe, Nd, which are capable of imparting the metal part and/or the oxidized metal part with a color in the visible light spectrum (e.g., between ~380 nm to ~740 nm).

In some examples, the doping process includes an ion implantation process, a thermal diffusion process or a molecular layer doping process. According to some examples, the ion implantation process involves bombarding the external surface 204 of the metal substrate 202 with highly energetic doping elements (e.g., the doping atom 212). The ion implantation process provides good control over the dosage and depth of the doping elements directed at the external surface 204. Moreover, the ion implantation process causes amorphization of the crystal lattice of the material that comprises the metal substrate 202 whereby the doping atom 212 substitutes for some of the metal atoms (e.g., Zr, Ti, etc.) that comprise the crystal lattice. According to some examples, the molecular layer doping process involves diffusing dopant atom 212 into the metal substrate 202. In contrast to the ion implantation process, the molecular layer doping process is a non-destructive method that does not alter the crystal lattice of the material that comprises the metal substrate 202. The doping processes described herein are distinct from sintering, whereby powder is pressed together and then sintered to form a color.

Figure 2C:
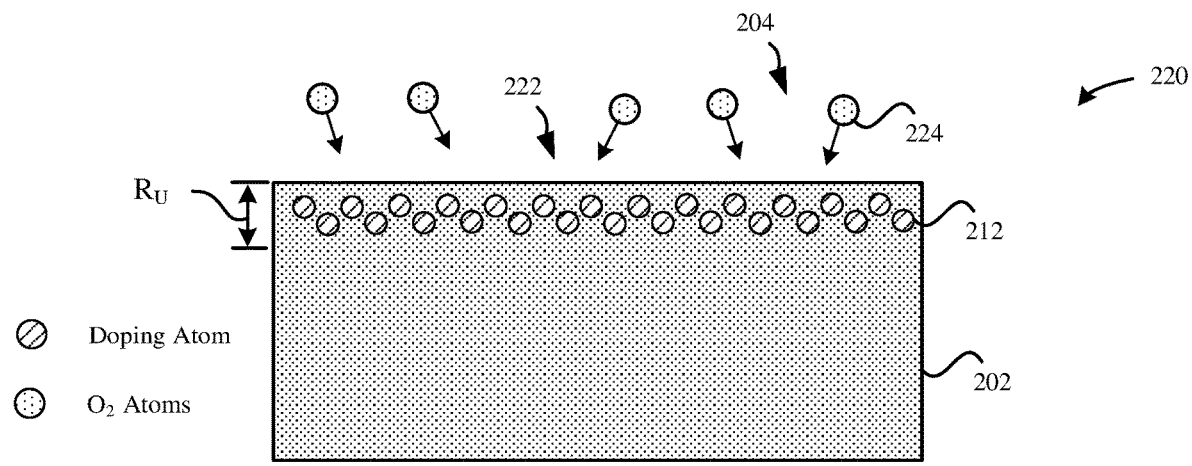

FIG. 2C illustrates a cross-sectional view of a doped metal part 220 subsequent to the doping process, in accordance with some embodiments. As a result of the doping process, the external surface 204 is modified to form a doped external surface 222. By using a controlled doping process (e.g., ion implantation, etc.), at least one doping atom 212 may be uniformly distributed through an upper region (Ru) of the doped metal part 220. However, in other examples, at least one doping atom 212 may be randomly dispersed throughout the upper region (Ru). According to some embodiments, the upper region (Ru) is defined as a region extending from the external surface 204 and into the metal substrate 202 that is less than 50% of a thickness of the metal substrate 202, less than 35% of a thickness of the metal substrate 202, or less than 25% of a thickness of the metal substrate 202.

As illustrated in FIG. 2C, the doped metal part 220 is exposed to an oxidation process. The oxidation process involves exposing the doped metal part 220 to oxygen atoms (02) 224 such as to form a doped metal oxide layer that overlays the metal substrate 202. In some examples, the oxidation process includes applying heat and/or vacuum pressure to the doped metal part 220.

In some embodiments, as a result of doping the metal substrate 202 with at least one doping atom 212, the material of the metal substrate 202 undergoes a change in electrical properties (i.e., changing the band gap). However, the doped metal substrate (non-oxidized) does not have a band gap; therefore, the doped metal substrate has a metallic color. Indeed, the non-oxidized, doped metal substrate will appear silver due to the metal reflecting substantially all visible wavelengths of light. Indeed, in order to attain a non-metallic, non-black, visible color, the doped metal substrate may be sintered, as described in more detail with reference to FIG. 8.

Figure 2D:
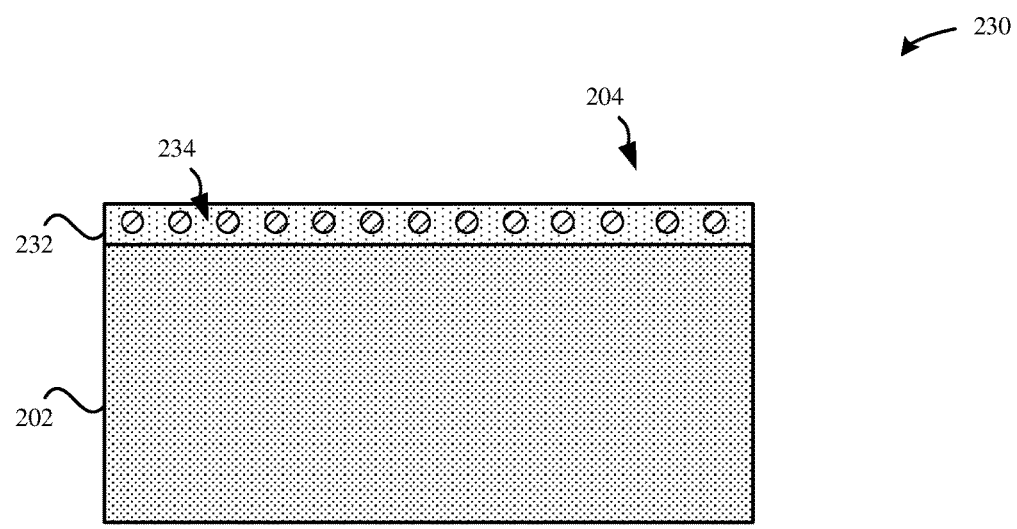

FIG. 2D illustrates a cross-sectional view of a doped oxidized part 230 subsequent to an oxidation process, in accordance with some embodiments. The doped oxidized part 230 includes a doped metal oxide layer 232. The doped oxidized part 230 includes metal oxide material 234. However, the atomic composition of the metal oxide material 234 is modified by incorporating the doping atoms 212 therein. In some examples, the doped metal oxide layer 232 includes between about 0.001 wt % to about 10 wt % of the doping atoms 212. In some examples, the doping atoms 212 of the doped oxidized part 230 will not be in particle form. In some embodiments, the doped oxidized part 230 has a uniform distribution of the doping atoms 212 within the metal oxide material 234.

Some conventional metal oxide materials may be characterized as an electrical insulator due to having a material with a band gap between the valence and conduction bands that is too wide for valence electrons to surmount. However, the doping process described herein (with reference to FIG. 2B) reduces the band gap between the valence and conduction bands such that the band gap is between 1.7 eV to 3.0 eV and is characterized as having a non-metallic, non-black color (e.g., purple, blue, etc.). It should be noted that the color of the doped oxidized part 230 are not dependent upon the thickness of the doped metal oxide layer 232.

Additionally, in some embodiments, the metal substrate 202 does not include aluminum. As a result, the metal oxide coating 230 is characterized as being free of pores. This is in contrast to anodized aluminum coatings having generally columnar pores.

Figure 3A:
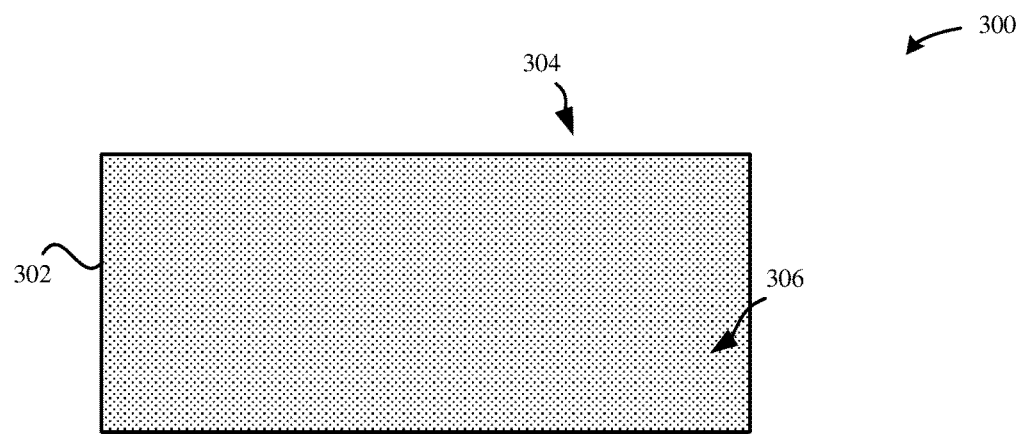
FIGS. 3A-3D illustrate cross-sectional views of a process for forming a doped metal oxide coating, in accordance with some embodiments.

FIGS. 3A-3D illustrate a cross-sectional view of a process for forming a doped metal oxide coating, in accordance with some embodiments. FIG. 3A illustrates a cross-sectional view of a metal part 300 prior to a doping process. The metal part 300 includes a metal substrate 302 having an external surface 304.

Figure 3B:
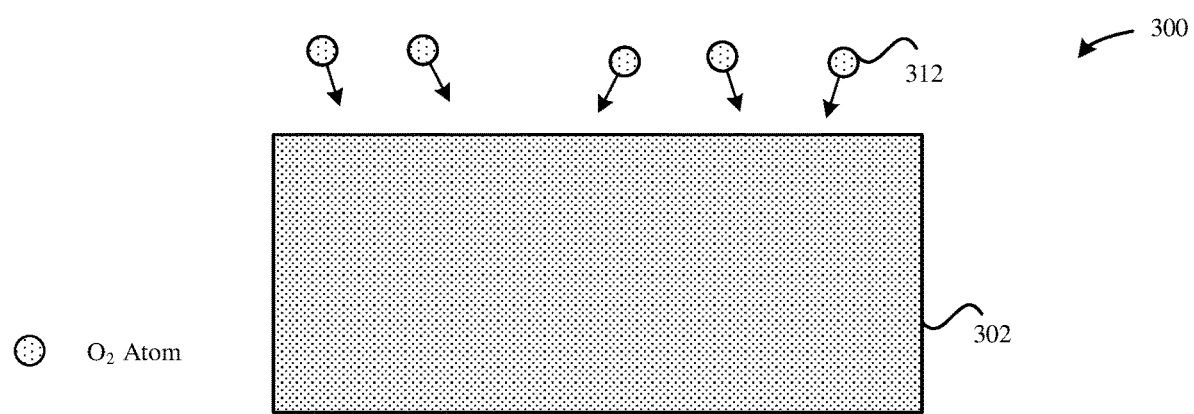

As illustrated in FIG. 3B, the metal part 300 is subjected to an oxidation process. In particular, the oxidation process involves exposing the metal substrate 302 to oxygen ions 312. In some examples, the metal substrate 302 is subjected to a controlled oxidation process in order to grow a metal oxide layer in a controlled manner. Beneficially, growing the metal oxide layer in a controlled manner ensures that the metal oxide layer has a uniform thickness. According to some embodiments, the metal oxide layer is characterized as an electrical insulator due to having a material with a band gap between the valence and conduction bands that is too wide for valence electrons to surmount. Accordingly, a doping process described herein (with reference to FIG. 3D) is required to reduce the band gap between the valence and conduction bands such as to impart the doped metal oxide layer with a non-metallic color (e.g., purple, blue, red, etc.).

Figure 3C:
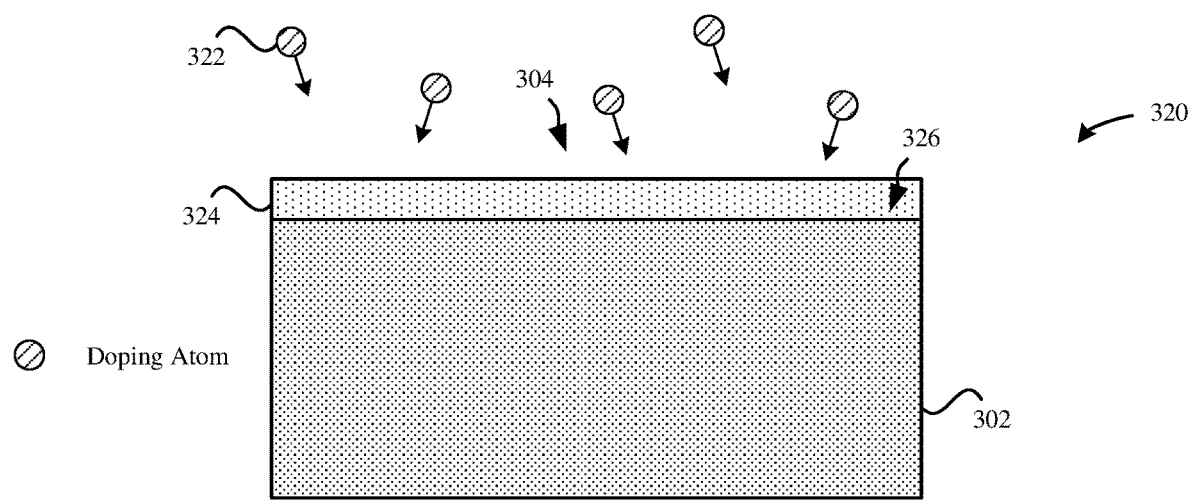

FIG. 3C illustrates a cross-sectional view of an oxidized part 320 subsequent to the oxidation process, in accordance with some embodiments. As illustrated in FIG. 3C, the oxidized part 320 includes a metal oxide layer 324 that overlays the metal substrate 302. The metal oxide layer 324 includes metal oxide material 326. In some examples, the metal oxide material 326 includes $ZrO_2$ or $TiO_2$. In some examples, the metal oxide layer 324 may be formed by an anodization process or a passivation process. For example, if the metal oxide layer 324 is formed by a passivation process, then the metal oxide layer 324 may be referred to as a passivation oxide layer or a native oxide layer. However, it should be noted that the passivation process is an uncontrolled, naturally-occurring oxidation process. In contrast, the anodization process is a controlled electrochemical process that utilizes an anodizing voltage (e.g., between 15 V to 21 V). Beneficially, if the metal substrate 302 is subjected to a controlled anodization process, the metal oxide layer 324 grows in a more controlled manner. As a result, the metal oxide layer 324 subsequent to an anodization process has a uniform thickness whereas the metal oxide layer 324 formed by a passivation process has a varied or non-uniform thickness.

Beneficially oxidizing the metal material 306 of the metal substrate 302 imparts the oxidized part 320 with an increased amount of hardness, which one of ordinary skill in the art would recognize is more desirable when the oxidized part 320 is utilized to protect operational components carried within the enclosure. In some examples, the oxidized part 320 has a hardness of greater than 1000 Hv.

Figure 3D:
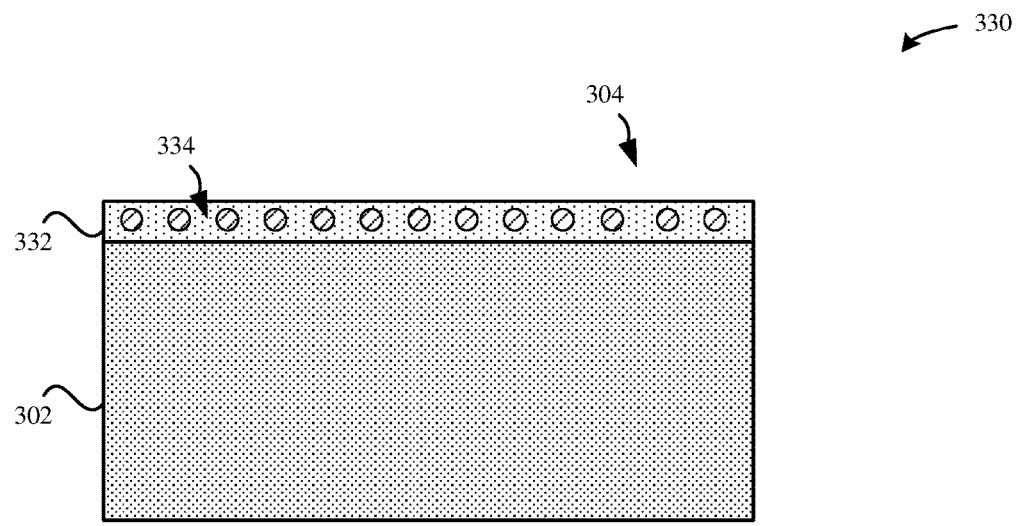

FIG. 3D illustrates a cross-sectional view of a doped oxidized part 330 subsequent to a doping process, in accordance with some embodiments. As illustrated in FIG. 3D, the doped oxidized part 330 is exposed to a doping process. The doping process includes depositing doping atom 322 onto the external surface 304 of the oxidized part 320. In some examples, the doping process includes an ion implantation process or a diffusion process. The doping process alters the electrical properties of the doped oxidized part 330. In some examples, the doping atoms 312 of the doped oxidized part 330 will not be in particle form.

As a result of the doping process, the doping atom 322 is incorporated into the metal oxide material 326 of the metal oxide layer 324, thereby forming a doped metal oxide layer 332. By incorporating the doping atom 322 within the metal oxide material 326, the doping atom 322 (e.g., atoms) will substitute for some of the metal ions present in the metal oxide material 326. For example, if the metal oxide material 326 is $ZrO_2$ and includes a crystal lattice of $Zr^+$ atoms, and the doping element is $Ce^{3+}$, then some of the $Zr^+$ atoms will be replaced by $Ce^{3+}$. Incorporating the doping element within the metal oxide material 326 forms a doped metal oxide material 334. The doped metal oxide material 334 has greater electrical conductivity than the metal oxide material 326 such that the doped metal oxide layer 332 has greater electrical conductivity than the metal oxide layer 324. According to some examples, the metal oxide material 326 includes between about 0.001 wt % to about 10 wt % of the doping atom 322.

In one example, the metal oxide material 326 includes $Zr^+$ atoms. Each of the $Zr^+$ atoms includes valence electrons. The valence electrons between adjacent $Zr^+$ atoms form bonds that hold the crystal lattice together. By undergoing the doping process, some of the $Zr^+$ atoms are substituted with $Ce^{3+}$. However, the force that holds the valence electron $Ce^{3+}$ in place is very weak. As a result, the valence electron can move about (orbit) the entire solid structure, this will increase electrical conductivity of the doped structure. As the extra valence electron moves about the doped structure it creates an empty unoccupied quantum state at the valence band that makes it easier for other valence electrons of other $Zr^+$ atoms to occupy due to there being lower energy.

FIG. 3D illustrates uniform distribution of the doping atoms 322 of the doped oxidized part 330. Additionally, there may also be non-uniform distribution. However, uniform distribution shows controlled doping which may be more desirable. In some embodiments, the doping is a controlled process, whereby the external atoms (i.e., dopants) are substituted into the crystal lattice of the in a controlled manner. As very small amounts of the dopants (in the parts-per-million range) can dramatically affect the electrical conductivity, careful measures may be implemented to ensure uniform spatial distribution of the dopants. For example, as a result of the controlled doping process, the doped metal oxide layer 332 may have a uniform distribution of the doping atom 322 through the crystal lattice of the metal oxide material 326 to ensure a uniform appearance of color throughout the surface area of the doped oxidized part 330. Generating a uniform appearance of color throughout millions of may be especially desirable and of importance for a manufacturer that produces on the scale of several thousands of enclosures for consumer electronic devices on a daily basis.

According to some embodiments, the doped oxidized part 230 of FIG. 2D and the doped oxidized part 330 of FIG. 3D may be characterized as having a non-metallic, visible color when visible light is incident upon an external surface of the doped metal oxide layer—e.g., the doped metal oxide layer 232. Referring to the doped oxidized part 230, when visible light is incident upon the doped external surface 222, photons of the visible light ray are absorbed by the doped metal oxide layer 232. When photons of the visible light ray strike the doped external surface 222, valence electrons that are present in the valence band may be excited to a higher energy level, which corresponds to the conduction band. In other words, the photons of the visible light ray have an amount of energy that is sufficient to excite valence electrons to a higher energy level in order to occupy a higher energy state in the conduction band.

The doped metal oxide material 234 is capable of absorbing an amount of energy (represented as a wavelength of light) from the photons of the visible light ray. In turn, an amount of energy (represented as a wavelength of light) of the visible light ray is absorbed by the doped metal oxide material 234. Any amount of energy which is greater than the amount of energy absorbed by the doped metal oxide material 234 is, in turn, reflected by the doped metal oxide material 234 as a reflected light ray. As will be described with reference to FIGS. 5A-5B and 6A-6B, the color of the doped oxidized part 230 corresponds to the amount of energy (represented as a wavelength of light) that is absorbed by the doped metal oxide material 234.

It should be noted that the doped oxidized part 230 imparts a color at the molecular level. In other words, the color of the doped oxidized part 230 is not correlated to the thickness of the doped metal oxide layer 232. To demonstrate this concept, even if the doped metal oxide layer 232 were separated from the remainder of the doped oxidized part 230 (i.e., the metal substrate 202), the doped metal oxide layer 232 would retain substantially the same color. In contrast, anodized coatings that are formed by anodizing a metal alloy substrate without doping the metal oxide material and/or the metal alloy substrate are capable of imparting a thin film interference effect. The thin film interference effect is dependent upon a refractive index of the anodized layer. For example, the color of the anodized layer is a function of the thickness of the anodized layer.

Figure 4:
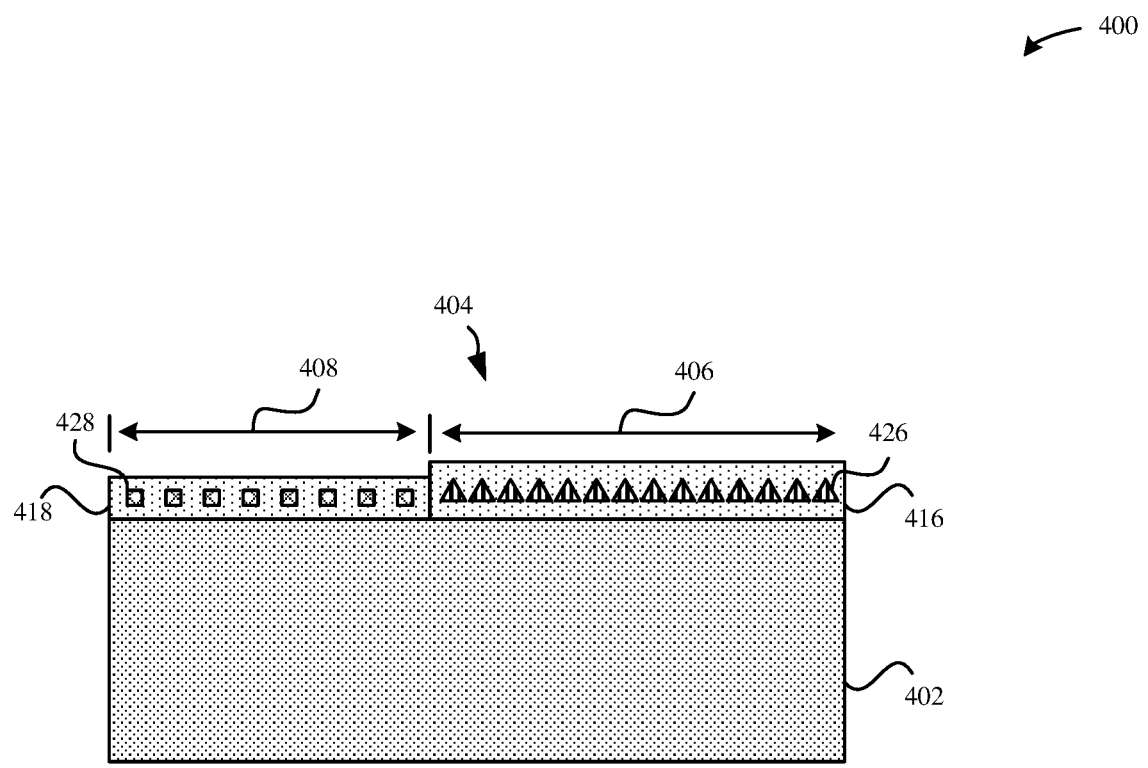
FIG. 4 illustrates a cross-sectional view of a doped metal oxide coating, in accordance with some embodiments.

FIG. 4 illustrates a cross-sectional view of a doped oxidized part 400, in accordance with some embodiments. The doped oxidized part 400 includes a metal substrate 402 that includes an external surface 404. The external surface 404 includes a first surface portion 406 and a second surface portion 408. The first surface portion 406 is doped with a first doping element 416 and the second surface portion 408 is doped with a second doping element 418. In some embodiments, the first and second surface portions 406, 408 may be exposed to different respective doping processes. For example, the first surface portion 406 is masked while the second surface portion 408 is exposed to a second doping process. The second doping process includes exposing the second surface portion 408 to the second doping element 428. Subsequently, the second surface portion 408 is masked while the first surface portion 406 is exposed to a first doping process. The first doping process includes exposing the first surface portion 406 to the first doping element 426.

Thereafter, the first and second surface portions 406, 408 that have been doped may be oxidized to form a first doped metal oxide layer 416 and a second doped metal oxide layer 418. In some examples, the first and second doped metal oxide layers 416, 418 may have uniform or non-uniform thicknesses. As a result of the first and second doped metal oxide layers 416, 418 being doped with different elements, these metal oxide layers will exhibit different colors that correspond to their respective band gap. However, despite generating different colors, the amount of the first and second doping elements 426, 428 is generally insufficient to alter the mechanical properties of the first and second metal oxide layers 416, 418. Furthermore, the first and second metal oxide layers may be generally translucent such that the underlying textures of the first and second surface portions are visible therethrough.

FIGS. 5A-5B illustrate cross-sectional views of a metal substrate having a color, in accordance with some embodiments. FIG. 5A illustrates a cross-sectional view of the metal part 200, as previously described with reference to FIG. 2A. The metal part 200 includes a metal substrate 202 that is without a doping element—e.g., the doping atom 212. Since the metal substrate 202 is without a doping element, the metal substrate 202 may be without a band gap between a valence band (Vb) and a conduction band (Cb), as illustrated in FIG. 5B.

FIG. 5B illustrates a band gap structure 500 that corresponds to the metal part 200. In some examples, the valence band (Vb) will overlap with the conduction band (Cb) such that there is no band gap. As a result, any visible light ray that is incident upon the external surface 204 of the metal substrate 202 will cause generally all visible light wavelengths to be absorbed by the metal material of the metal substrate 202. In turn, the metal part 200 will appear black or near black.

In order to alter the electronic structure of the metal part 200 such as to impart a non-black color, it may be necessary to dope the metal substrate 202 and/or a metal oxide layer derived from the metal substrate 202 with a doping element—e.g., the doping atom 212.

FIGS. 6A-6B illustrate cross-sectional views of a doped metal oxide coating having a color in accordance with a band gap, in accordance with some embodiments. FIG. 6A illustrates a cross-sectional view of the doped oxidized part 230, as previously described with reference to FIG. 2D. The doped oxidized part 230 includes a doped metal oxide layer 232 that overlays a metal substrate 202. In contrast to the metal part 200, the doped oxidized part 230 has been doped with a doping element—e.g., the doping atom 212.

FIG. 6B illustrates a band gap structure 600 that corresponds to the doped oxidized part 230. In contrast to the band gap structure 500 of the metal part 200, the band gap structure 600 has a band gap that separates the conduction band (Cb) from the valence band (Vb). When visible light rays are incident upon the external surface 204 of the doped metal oxide layer 232, energy associated with the visible light rays excites valence electrons that are present in the valence band. The amount of energy associated with the visible light rays is sufficient to excite the valence electrons to reach the next energy level—i.e., the conduction band. The amount of energy sufficient to excite the valence electrons corresponds to the band gap. In turn, the excited valence electrons leave behind unoccupied quantum states in the valence band. In some examples, the doped oxidized part 230 will exhibit a band gap greater than about 1.70 eV and less than about 3.0 eV. As a result, the doped oxidized part 230 will have a color that correspond to the band gap, as will be described in greater detail with reference to FIGS.

7A-7C. In other words, the color of light that is reflected or transmitted by the doped oxidized part 230 corresponds to the band gap.

FIGS. 7A-7C illustrate various exemplary doped metal oxide coatings having different colors, in accordance with some embodiments.

FIG. 7A illustrates a band gap structure 700-A of a doped metal oxide coating where the band gap between the valence band (Vb) and the conduction band (Cb) is 1.2 eV. The doped metal oxide coating includes metal oxide material that is doped with one or more foreign atoms. As a result, when visible light is incident upon an external surface of the doped metal oxide coating, the doped metal oxide coating will absorb all energy greater than 1.2 eV. In this particular instance, all visible wavelengths of light have an energy greater than 1.2 eV; therefore, the doped metal oxide coating will absorb generally all visible wavelengths of light and appear black or near black. In some examples, the color of the doped metal oxide coating that corresponds to the band gap structure 700-A is characterized as having an L* value of less than 40. As generally understood, L*=0 represents an extreme black while L*=100 represents white.

FIG. 7B illustrates a band gap structure 700-B of a doped metal oxide coating where the band gap between the valence band (Vb) and the conduction band (Cb) is 1.8 eV. When visible light is incident upon an external surface of the doped metal oxide coating, the doped metal oxide coating will absorb all energy greater than 1.8 eV. In this particular instance, light having a red color has an energy that is less than 1.8 eV. Therefore, the doped metal oxide coating will absorb substantially all visible light except for light having a red color. Accordingly, the doped metal oxide coating will appear red. In some examples, the color of the doped metal oxide coating that corresponds to the band gap structure 700-B is characterized as having a positive value of greater than 0 and less than 5.

FIG. 7C illustrates a band gap structure 700-C of a doped metal oxide coating where the band gap between the valence band (Vb) and the conduction band (Cb) is 2.5 eV. When visible light is incident upon an external surface of the doped metal oxide coating, the doped metal oxide coating will absorb all energy greater than 2.5 eV. In this particular instance, light having red, orange, yellow, and green colors have an energy that is less than 2.5 eV. Therefore, the doped metal oxide coating will absorb substantially all visible light except for light having red, orange, yellow, and green colors. Accordingly, the doped metal oxide coating will appear a red/orange/yellow/green mixture. In some examples, the color of the doped metal oxide coating that corresponds to the band gap structure 700-C is characterized as having a positive b* value of greater than 0 and less than 5.

It should be noted from these examples that a greater amount of energy is required to excite valence electrons from the valence band to the conduction band in order to impart a blue or purple color. As described herein, the dopant of the metal oxide coating may include Ce, Dy, Er, Eu, Gd, Ho, La, Lu, Nd, Pr, Pm, Sm, Sc, Tb, Tm, Yb, and Y. Notably, in the examples described herein, it may be possible to infer the specific type of dopant included in a doped metal oxide coating based upon the color of the doped metal oxide coating.

In some examples, a metal oxide coating doped with Er is characterized as having a peach or pink color that is defined as an a* value greater than 0, and a b* value less than 25.

In some examples, a metal oxide coating having Pr is characterized as having a yellow color that is defined as a b* value greater than 0.

In some examples, a metal oxide coating doped with Nd is characterized as having a purple color that is defined as a negative b* value that is less than 0.

In some examples, a metal oxide coating doped with Ni is characterized as having a green color that is defined as a negative a* value that is less than 0.

In some examples, a metal oxide coating doped with Co is characterized as having a dark blue color that is defined as a negative b* value that is less than 0.

Figure 8:
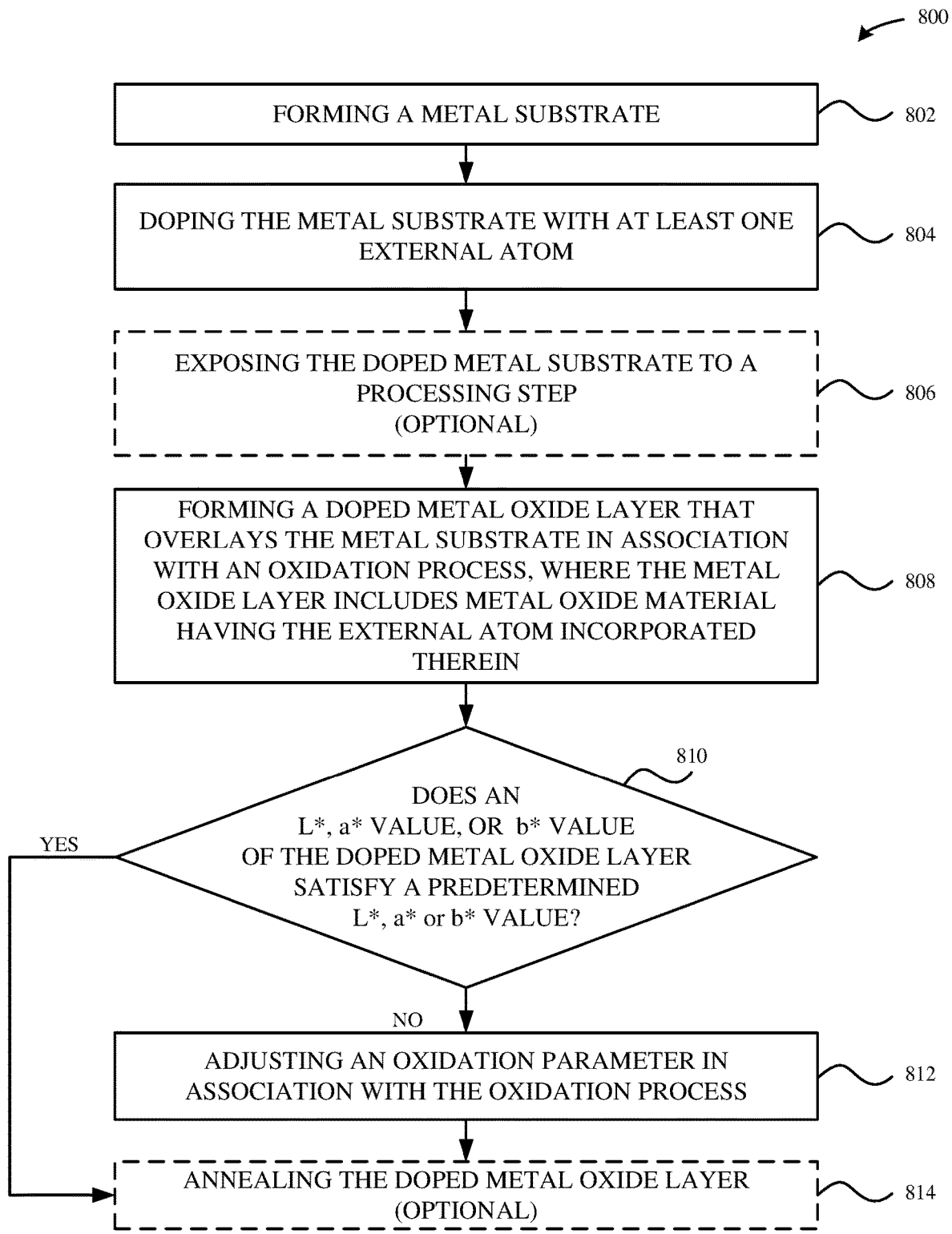
FIG. 8 illustrates a method for forming a doped metal oxide coating, in accordance with some embodiments.

FIG. 8 illustrates a method 800 for forming a doped metal oxide coating, in accordance with some embodiments. In some embodiments, the method 800 may be implemented in conjunction with a closed feedback loop that is implemented by an optical detection system and/or a controlled oxidation system.

As illustrated in FIG. 8, the method 800 begins at step 802, which involves forming a metal substrate—e.g., the metal substrate 202. The metal substrate 202 includes a pure metal or a metal alloy. In some examples, the metal substrate 202 includes a metal composition having a minimal and/or no band gap; therefore, the metal substrate 202 has a black or substantially black color. As described herein, a substantially black color refers to an L* value that is less than 30. As a result, the metal substrate 202 should be doped to impart a non-black color.

At step 804, the metal substrate 202 is doped with at least one external element or doping atom—e.g., the doping atom 212 in conjunction with a doping process. The doping process may include exposing the metal substrate 202 to ion implantation, a molecular layer doping process, a thermal diffusion process, and the like.

In some embodiments, the metal substrate 202 may be doped with multiple, different types of external elements. For example, if the metal substrate is titanium, then the external elements may include neodymium and praseodymium. In some embodiments, the metal substrate is doped with a first amount of the neodymium and a second amount of praseodymium, where the second amount is different from the first amount. As a result of the doping process, the metal substrate 202 is doped to form a doped metal part—e.g., the doped metal part 220. The doped metal part 220 includes a crystal lattice, where some of the metal atoms (e.g., titanium) are substituted with the one or more doping atoms. For example, some of titanium atoms may be substituted with at least one of neodymium or praseodymium. In some examples, where the metal substrate 202 is subjected to ion implantation, the ion implantation process amorphizes the crystal lattice to such an extent that damage to the crystal lattice may occur.

As a result of doping the metal substrate 202 with the at least one doping atom 212, the material of the metal substrate 202 undergoes a change in electrical properties (i.e., changing the band gap). However, the doping process in itself may be insufficient to result in a change of color.

At step 806, the metal substrate 202 may be optionally processed. In one example, the doped metal substrate may be sintered such as to be imparted with a non-black, visible color (e.g., red, etc.). In some examples, the sintering process includes compressing a solid mass of material onto a surface of the doped metal substrate with heat or pressure. It should be noted that an oxidation step does not usually follow the sintering process.

In another example, the doped metal substrate may be repaired by exposing the doped metal part 220 to an annealing process. The annealing process is performed to repair any damage caused by the doping process. For example, diffusion or movement of the doping atoms 212 may cause the doping atoms 212 to diffuse deeper into the crystal lattice. The annealing process may include exposing the doped metal part 220 to a high temperature.

At step 808, the doped metal part 220 may be oxidized to form a doped oxidized part 230. In particular, the doped metal part 220 is exposed to oxygen atoms—e.g., the oxygen atoms 222. In some embodiments, the doped metal part 220 is oxidized in a controlled manner such that the resulting doped metal oxide layer 232 has a uniform or substantially uniform thickness. The doped metal oxide layer 232 includes a doped metal oxide material (e.g., titanium dioxide) having a crystal lattice, where some of the titanium atoms remain substituted with at least one of neodymium or praseodymium. In some embodiments, the doped metal part 220 is also oxidized in a controlled manner such as to more precisely control the thickness and/or color of the doped oxidized part 230. The doped metal oxide layer 232 includes doped metal oxide material 234.

At step 810, an optical detection system may be utilized to monitor the color of the doped metal oxide layer 232. In some embodiments, the optical detection system may determine whether the color of the doped oxidized part 230 satisfies predetermined value and/or range. For example, the optical detection system may determine at least one of whether the L* value of the doped metal oxide layer 232 satisfies a predetermined L* value, the a* value of the doped metal oxide layer 232 satisfies a predetermined a* value or the b* value of the doped metal oxide layer 232 satisfies a predetermined b* value.

At step 812, if the optical detection system determines that the doped metal oxide layer 232 has a color that does not satisfy any one of the predetermined L*, a* or b* values, then an oxidation parameter (e.g., voltage, anodizing solution, doping elements, concentration of dopants, etc.) may be adjusted in order to cause the doped oxidized part 230 to satisfy any one of the predetermined L*, a* or b* values.

Alternatively, at step 814, if the optical detection system determines that the doped metal oxide layer 232 has a color that satisfies any one of the predetermined L*, a* or b* values, then the doped oxidized part 230 may be subjected to an annealing process. As a result, the annealing process may further tune the color of the doped oxidized part 230, such as increasing the saturation of the color. The annealing process may also restore some of the metal oxide material subsequent to the doping process.

Figure 9:
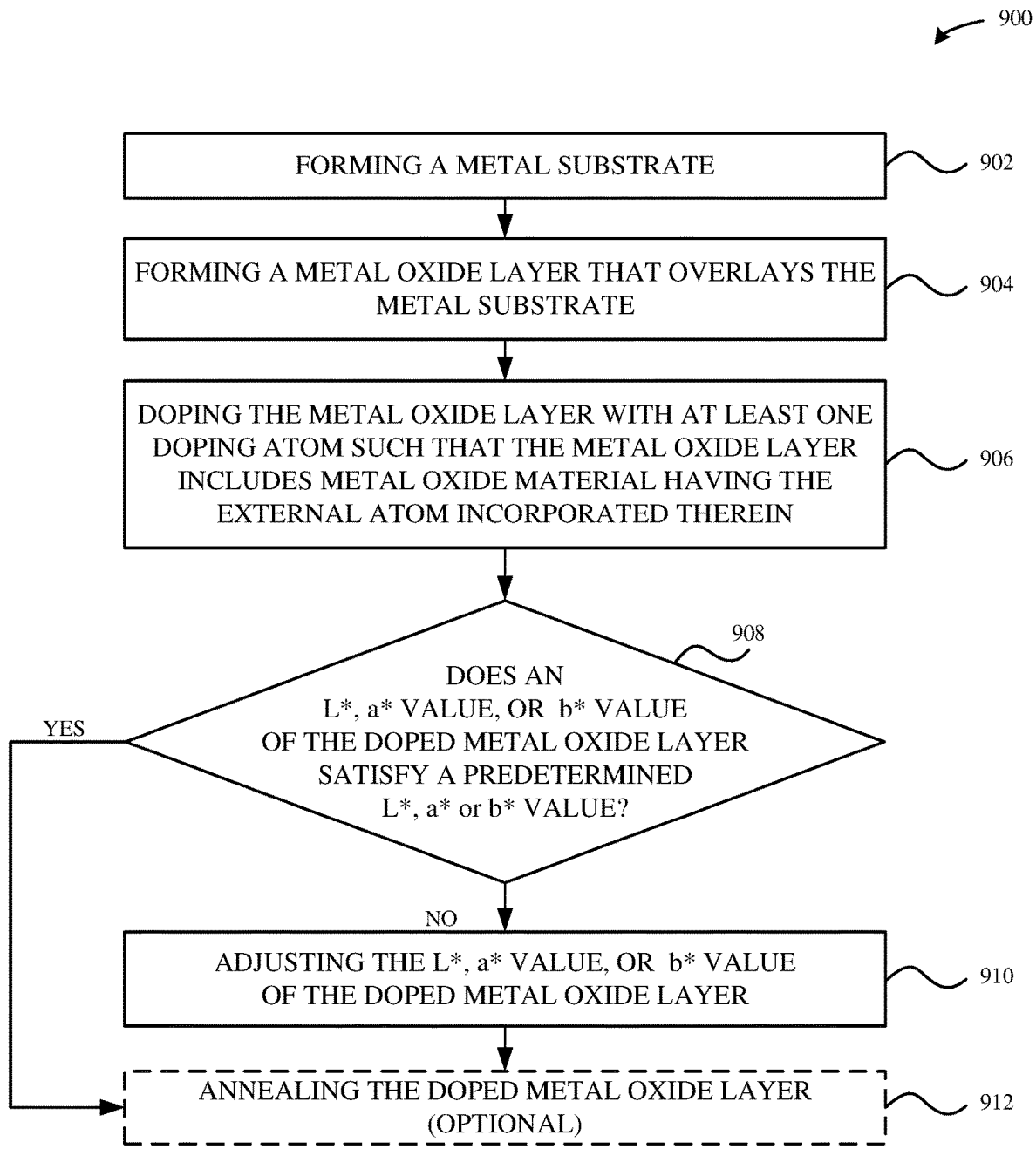
FIG. 9 illustrates a method for forming a doped metal oxide coating, in accordance with some embodiments.

FIG. 9 illustrates a method 900 for forming a doped metal oxide coating, in accordance with some embodiments. In some embodiments, the method 900 may be implemented in conjunction with a closed feedback loop that is implemented by an optical detection system and/or a controlled oxidation system.

As illustrated in FIG. 9, the method 900 begins at step 902, which involves forming a metal substrate—e.g., the metal substrate 302. The metal substrate 302 includes a pure metal or a metal alloy. In some examples, the metal substrate 302 includes a metal composition having a minimal and/or no band gap; therefore, the metal substrate 302 has a black or substantially black color.

At step 904, the metal substrate 302 may be oxidized to form an oxidized part 320. In particular, the metal substrate 302 is exposed to oxygen atoms—e.g., the oxygen atoms 312. In some embodiments, the metal substrate 302 is oxidized in a controlled manner such that the resulting metal oxide layer 324 of the oxidized part 320 has a uniform or substantially uniform thickness. The metal oxide layer 324 includes metal oxide material 326 (e.g., zirconium oxide) having a crystal lattice.

At step 906, the metal oxide layer 324 is doped with at least one external element or doping atom—e.g., the doping atom 322 in conjunction with a doping process to form a doped metal oxide layer 332. The doping process may include exposing the oxidized part 320 to ion implantation, a molecular layer doping process, a thermal diffusion process, and the like. In some embodiments, the metal substrate 202 may be doped with multiple, different types of external elements.

As a result of the doping process, the oxidized part 320 is doped to form a doped oxidized part 330. The doped oxidized part 330 includes a crystal lattice of doped metal oxide material 334, where some of the metal atoms (e.g., titanium) are substituted with the one or more doping atoms 322. For example, some of the zirconium atoms may be substituted with the doping atoms 322.

At step 908, an optical detection system may be utilized to monitor the color of the doped metal oxide layer 332. In some embodiments, the optical detection system may determine whether the color of the doped oxidized part 330 satisfies predetermined value and/or range. For example, the optical detection system may determine at least one of whether the L* value of the doped metal oxide layer 332 satisfies a predetermined L* value, the a* value of the doped metal oxide layer 332 satisfies a predetermined a* value or the b* value of the doped metal oxide layer 332 satisfies a predetermined b* value.

At step 910, if the optical detection system determines that the doped metal oxide layer 332 has a color that does not satisfy any one of the predetermined L*, a* or b* values, then an oxidation parameter (e.g., voltage, anodizing solution, doping elements, concentration of dopants, etc.) may be adjusted in order to cause the doped oxidized part 330 to satisfy any one of the predetermined L*, a* or b* values.

Alternatively, at step 912, if the optical detection system determines that the doped metal oxide layer 332 has a color that satisfies any one of the predetermined L*, a* or b* values, then the doped oxidized part 330 may be subjected to an annealing process. In some examples, the annealing process may further create oxygen vacancies in the doped metal oxide material 334. As a result, the annealing process may further tune the color of the doped oxidized part 330, such as increasing the saturation of the color. The annealing process may also restore some of the metal oxide material subsequent to the doping process. Additionally, the annealing process may also precipitate additional phases in the doped metal oxide layer 332 such as inter-metallic compounds, silicates, or spin-off phases, which are detectable due to increased light absorption leading to more saturated colors. In some examples, where the oxidized part 320 is subjected to ion implantation, the ion implantation process amorphizes the crystal lattice to such an extent that damage to the crystal lattice may occur.

Figure 10:
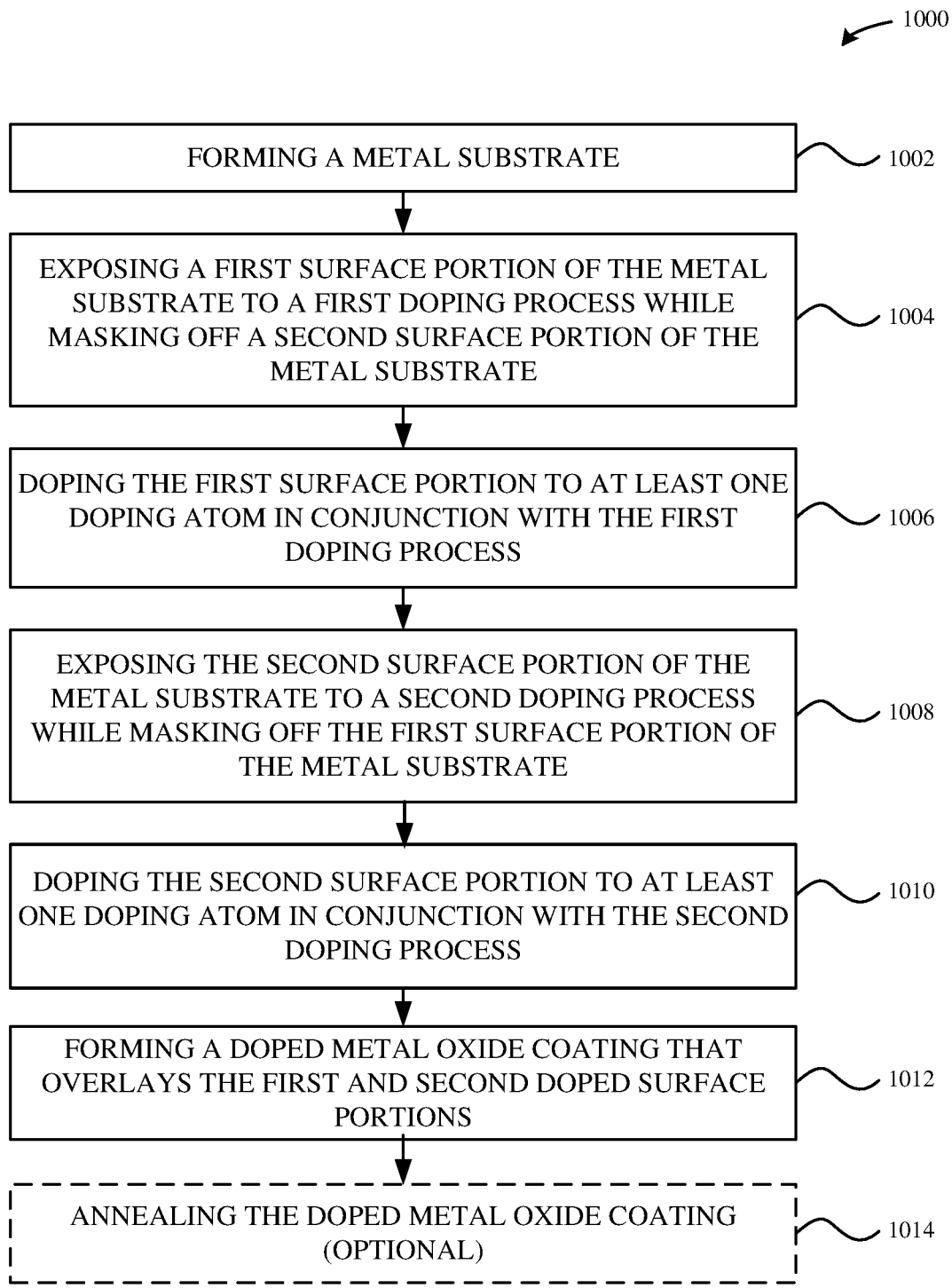
FIG. 10 illustrates a method for forming a doped metal oxide coating, in accordance with some embodiments.

FIG. 10 illustrates a method 1000 for forming a doped metal oxide coating, in accordance with some embodiments. As illustrated in FIG. 10, the method 1000 begins at step 1002, which involves forming a metal substrate—e.g., the metal substrate 402. The metal substrate 402 includes a pure metal or a metal alloy.

At step 1004, a second surface portion 408 of an external surface 404 of the metal substrate 402 may be masked while leaving a first surface portion 406 of the external surface 404 of the metal substrate 402 exposed to a first doping process. At step 1006, the first surface portion 406 is doped with a first type of doping element 426 in conjunction with a first doping process.

At step 1008, the first surface portion 416 of the metal substrate 402 is masked off while leaving the second surface portion 408 exposed to a second doping process. At step 1010, the second surface portion 408 is doped with a second type of doping element 428 that is different from the first type of doping element 426. In some examples, the first and second doping processes may include different types of doping elements and/or different concentrations of the doping elements.

At step 1012, the first and second surface portions 406, 408 of the doped metal substrate may be oxidized to form first and second doped metal oxide layers 416, 418 that overlays the first and second surface portions 406, 408, respectively. In some embodiments, the first and second surface portions 406, 408 that were doped are oxidized in a controlled manner such that the first and second doped metal oxide layers 416, 418 have a uniform or substantially uniform thickness. In some embodiments, the first doped metal oxide layer 416 includes the first type of doping element 416 and the second doped metal oxide layer 418 includes the second type of doping element 418.

At step 1014, the first and second doped metal oxide layers 416, 418 may be subjected to an annealing process. As a result, the annealing process may further tune the color of the doped oxidized part 400, such as increasing the saturation of the color. The annealing process may also restore some of the metal oxide material subsequent to the doping process.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a nontransitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The nontransitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A portable electronic device comprising:
    an enclosure, including:
        a metal alloy substrate that includes a dopant; and
        a metal oxide layer overlaying and formed from the metal alloy substrate, wherein the dopant in the metal alloy substrate is only dispersed in an upper region of the metal alloy substrate, the upper region extending from an external surface and into the metal alloy substrate and comprising less than 50% of a thickness of the metal alloy substrate.

2. The portable electronic device of claim 1, wherein the metal alloy substrate includes at least one of titanium, zirconium or steel.

3. The portable electronic device of claim 1, wherein the dopant includes a transition metal or a rare earth element.

4. The portable electronic device of claim 1, wherein the the metal oxide layer includes a metal oxide material including the dopant, and the metal oxide material is characterized as having a band gap disposed between a valence band and a conduction band.

5. The portable electronic device of claim 4, wherein the metal oxide layer includes an external surface, and when visible light is incident upon the external surface, the metal oxide material including the dopant absorbs photons of the visible light such as to impart the metal oxide layer with a color that corresponds to the band gap.

6. The portable electronic device of claim 5, wherein the band gap is between 1.2 eV to 3 eV.

7. An enclosure for a portable electronic device, the enclosure comprising:
    a substrate that includes a metal alloy; and
    a metal oxide layer overlaying the substrate, wherein the metal oxide layer includes metallic atoms and a dopant so that the metal oxide layer is characterized as having a band gap, wherein the dopant is additionally present only in an upper region of the substrate, and in a uniform distribution, the upper region extending from an external surface and into the substrate and comprising less than 50% of a thickness of the substrate.

8. The enclosure of claim 7, wherein when visible light is incident upon an external surface of the metal oxide layer, the metal oxide layer absorbs a selected wavelength of the visible light that corresponds to the band gap.

9. The enclosure of claim 7, wherein the metal oxide layer is characterized as having a hardness of 1000 Hv or greater.

10. The enclosure of claim 7, wherein the metal oxide layer includes between 0.001 wt % to 10 wt % of the dopant.

11. The enclosure of claim 7, wherein the dopant is a transition metal or a rare earth element.

12. The enclosure of claim 7, wherein the band gap is between 1.2 eV to 3 eV.

13. An enclosure for a portable electronic device, the enclosure comprising:
    a metal substrate; and
    a metal oxide coating overlaying the metal substrate, the metal oxide coating including a first surface portion and a second surface portion adjacent to the first surface portion, wherein the first surface portion includes a first dopant and the second surface portion includes a second dopant different than the first dopant, wherein the first dopant and the second dopant are additionally present and dispersed only throughout an upper region of the metal alloy substrate, the upper region extending from an external surface into the metal substrate and comprising less than 50% of a thickness of the metal substrate.

14. The enclosure of claim 13, wherein the metal oxide coating is characterized as having a hardness of 1000 Hv or greater.

15. The enclosure of claim 13, wherein the first and second dopants include at least one of a rare earth element or a transition metal.

16. The enclosure of claim 13, wherein the metal oxide coating has a uniform thickness.

17. The enclosure of claim 13, wherein the metal oxide coating is free of pores.

18. The enclosure of claim 13, wherein the first surface portion is characterized as having a first band gap, and the second surface portion is characterized as having a second band gap greater than the first band gap.

* * * * *